(12) United States Patent
Mo et al.

(10) Patent No.: US 6,404,007 B1
(45) Date of Patent: Jun. 11, 2002

(54) TRENCH TRANSISTOR WITH SUPERIOR GATE DIELECTRIC

(75) Inventors: Brian Sze-Ki Mo, Fremont; Duc Chau, San Jose, both of CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/286,168

(22) Filed: Apr. 5, 1999

(51) Int. Cl.[7] .................. H01L 29/792; H01L 29/76
(52) U.S. Cl. .................. 257/324; 257/325; 257/332
(58) Field of Search .................. 257/324, 325, 257/326, 330, 332

(56) References Cited

U.S. PATENT DOCUMENTS

| | | | |
|---|---|---|---|
| 4,326,332 A | 4/1982 | Kenney | 29/571 |
| 4,716,126 A | 12/1987 | Cogan | 437/24 |
| 4,746,630 A | 5/1988 | Hui et al. | 437/235 |
| 4,774,556 A | * 9/1988 | Fujii et al. | |
| 4,914,058 A | 4/1990 | Blanchard | 437/203 |
| 4,967,245 A | 10/1990 | Cogan et al. | 357/23.4 |
| 4,990,463 A | 2/1991 | Mori | 437/52 |
| 5,350,937 A | * 9/1994 | Yamazaki et al. | 257/316 |
| 5,429,977 A | 7/1995 | Lu et al. | 437/52 |
| 5,567,634 A | 10/1996 | Hebert et al. | 437/41 |
| 5,595,927 A | 1/1997 | Chen et al. | 437/52 |
| 5,665,619 A | 9/1997 | Kwan et al. | 438/270 |

FOREIGN PATENT DOCUMENTS

| | | | |
|---|---|---|---|
| JP | 63-288047 A | 11/1988 | H01L/21/90 |
| JP | 62-179482 | 1/1989 | H01L/21/94 |

OTHER PUBLICATIONS

"Two Dimensional Thermal Oxidation of Silicon–II. Modeling Stress Effects in Wet Oxides," Kao et al., *IEEE Transactions on Electron Devices*, vol. ED–35, No. 1, Jan. 1988.

"Two Dimensional Thermal Oxidation of Silicon–I. Experiments," Kao et al., *IEEE Transactions on Electron Devices*, vol. ED–34, No. 5, May 1987.

* cited by examiner

*Primary Examiner*—Ngân V. Ngô
(74) *Attorney, Agent, or Firm*—Townsend and Townsend and Crew, LLP

(57) ABSTRACT

A trench transistor with lower leakage current and higher gate rupture voltage. The gate oxide layer of a trench transistor is grown at a temperature above about 1100° C. to reduce thinning of the oxide layer at the corners of the trench. In a further embodiment, a conformal layer of silicon nitride is deposited over the high-temperature oxide layer, and a second oxide layer is formed between the silicon nitride layer and the gate polysilicon. The first gate oxide layer, silicon nitride layer, and second oxide layer form a composite gate dielectric structure that substantially reduces leakage current in trench field effect transistors.

7 Claims, 5 Drawing Sheets

TRENCH TRANSISTOR WITH SUPERIOR GATE DIELECTRIC

BACKGROUND OF THE INVENTION

The present invention relates in general to field effect transistors, and in particular trench transistors and methods of their manufacture.

FIG. 1 is a simplified cross section of a portion of a conventional metal-oxide-semiconductor field-effect transistor ("MOSFET") trench transistor. A trench 10 is lined with an electrically insulating material 12 that will act as a gate dielectric, and is filled with a conductive material 14, such as polysilicon, which forms the gate. The trench, and hence the gate, extend from the surface of the silicon into the substrate down through a body region 22 (in this case a P-type region) and a drain region 16 (in this case an n-type region). Drain region 16 may be electrically contacted through the substrate of the device. N-type regions on either sides of trench 14 form source terminal 18 of the MOSFET. An active channel region 20 is thus formed along side of trench 16 between source regions 18 and drain region 16.

Trench transistors are often used in power-handling applications, such as power management circuitry for a computer. Trench transistors often operate at 5–100 V, as compared to 2–5 V for a logic-type MOSFET, and trench transistors may control up to 100 amps of current in some applications. Different operating conditions create different problems that must be addressed by proper design of the devices. For example, logic and other low-voltage MOSFETs typically do not have to withstand the voltage differentials that can appear across the terminals of a trench transistor, such as between the gate and drain ("$V_{GD}$"). These high voltages can stress the gate oxide, causing breakdown and degradation leading to device failure.

The gate oxide of a conventional MOSFET is typically formed on a planar surface of a semiconductor wafer. Forming a high-quality oxide layer on a planar surface is relatively simple compared to forming a high-quality oxide layer in a trench for several reasons. One difficulty is that thermally grown oxide will grow faster on a flat surface than at a corner. FIG. 2 is a simplified cross section of a portion of a silicon wafer 30 with a convex corner 32 and a concave corner 34. A layer of thermal oxide 36 is thinner at both the convex corner and at the concave corner. Further, because of higher stress at the silicon-oxide interface at the corners, the corner Si—O bonds are more strained and thus require lower energy to break them. The combination of the thinner oxide and the strained Si—O bonds at the corners make the corner structure less resistant to breakdown at a given electric field across the gate oxide. As a result, the device may exhibit higher leakage currents and suffer related yield and reliability problems. The leakage and other reliability problems are exacerbated by the dry etch process that is typically used to form the trench. Dry etching leaves relatively rough trench walls and creates dangling bonds that further contribute to the leakage.

Thus, it is desirable to produce a trench transistor with a gate dielectric of more uniform thickness, and lower gate leakage current.

SUMMARY OF THE INVENTION

The present invention provides a trench metal oxide semiconductor field effect transistor (MOSFET) with a rugged gate dielectric layer which exhibits lower gate leakage current. Gate dielectric (e.g. oxide) is grown on the trench walls and bottom at a temperature sufficiently high to reduce the viscosity of the oxide during growth to result in an oxide layer of more uniform thickness. In one embodiment, the high-temperature oxide layer is grown at 1,100° C. to a thickness of about 500 Å thick and exhibits reduced gate leakage current and higher gate rupture voltage compared to a trench transistor with a gate oxide layer of similar thickness grown at the lower temperatures (e.g., 950° C.) conventionally used in the industry. In a preferred embodiment, a gate dielectric layer is made from a first layer of high-temperature gate oxide, a layer of silicon nitride, and a second layer of gate oxide. This composite gate dielectric layer at optimized thicknesses results in even lower gate leakage current and higher gate rupture voltage.

Accordingly, in one embodiment, the present invention provides a field effect transistor formed on a silicon substrate, the transistor including a trench extending into the substrate, the trench having a gate oxide layer having been grown at a temperature above about 1,100° C. to result in the gate oxide layer having a thickness that is substantially uniform, the gate oxide layer having substantially uniform stress.

In another embodiment, the present invention provides a field effect transistor formed on a silicon substrate, the transistor including a trench extending into the substrate, the trench being substantially filled by a conductive material that is separated from trench walls and bottom by a dielectric material, the dielectric material including: a silicon nitride layer sandwiched between a first oxide layer adjacent to the trench walls and bottom, and a second oxide layer adjacent to the conductive material, the first oxide layer having a thickness that is substantially greater than that of the second oxide layer.

The following detailed description and the accompanying drawings provide a better understanding of the nature and advantages of the trench transistor with rugged gate oxide according to the present invention.

DESCRIPTION OF THE SPECIFIC EMBODIMENTS

Trench transistors with superior gate dielectric layers can be fabricated by improving the consistency of the dielectric layer thickness, by reducing the stress in certain regions of the layer, and by improving the dielectric strength of the dielectric layer. These superior gate dielectric characteristics result in trench transistors with lower gate leakage currents and higher gate dielectric rupture voltages, thus providing devices with both improved performance and reliability.

Figure 1:
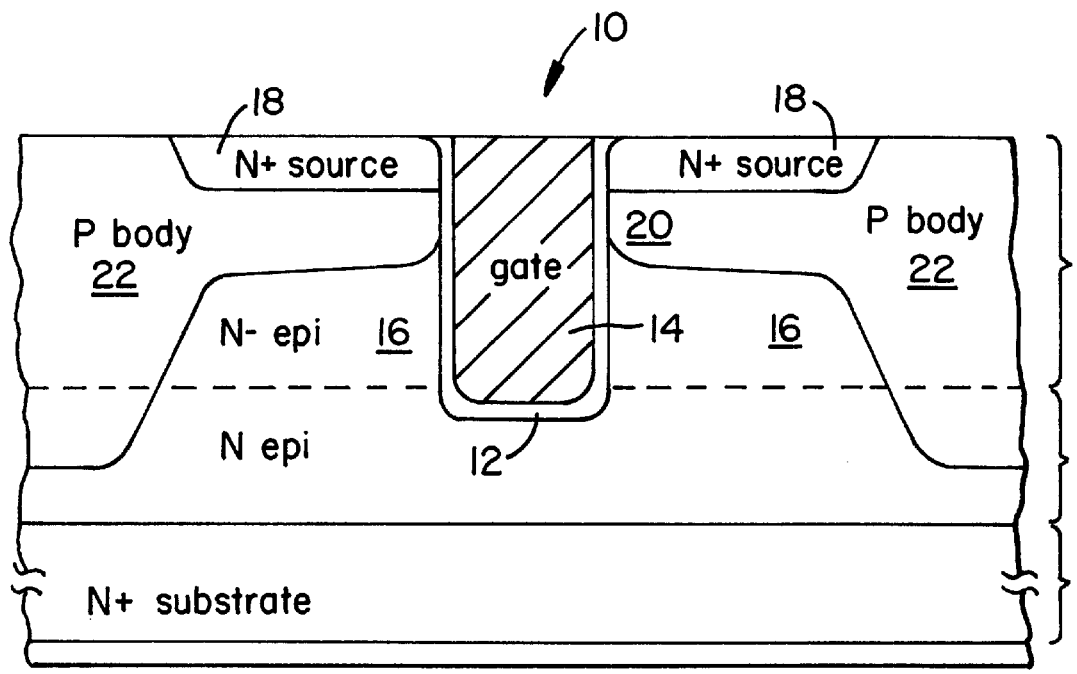
FIG. 1 is a simplified cross section of an exemplary conventional trench transistor.
Figure 2:
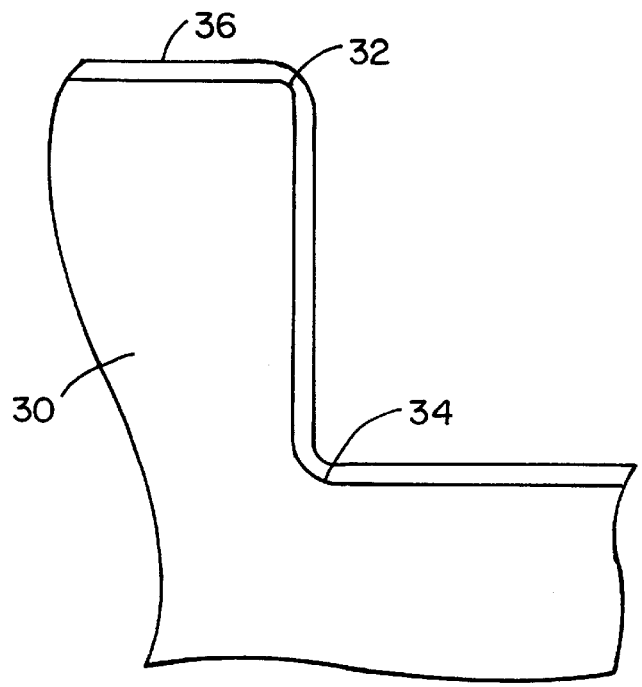
FIG. 2 is a simplified cross section of a thermal oxide layer on a portion of a silicon wafer having a convex corner and a concave corner.
Figure 3:
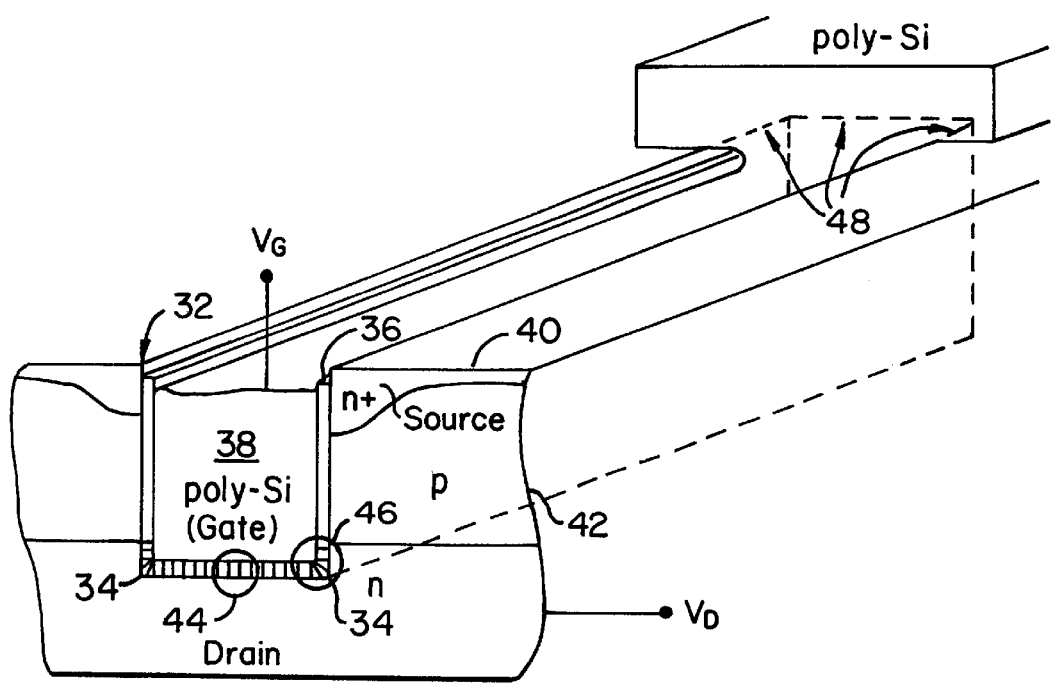
FIG. 3 is a diagram illustrating trench corners along longitudinal axis of an open cell trench transistor.

As described in connection with FIG. 2, in trench MOSFETs, the gate dielectric layer must typically cover concave and convex corners of the trench. Referring to FIG. 3, the top of the trench has convex corners 32, while the bottom of the trench has concave corners 34. In some cases, gate material 38 (e.g. polysilicon) that substantially fills the trench may be etched below surface 40 of substrate 42. This forms a recess that eliminates the need for dielectric layer 36 to cover convex corners 32. However, in addition to the remaining concave corners 34, convex corners 48 are formed at the longitudinal end of the trench, all of which are potential weak spots in gate dielectric layer 36.

Leakage current and breakdown voltage at the concave corners of a trench transistor are influenced by several factors that are by and large negligible in the context of other known trench structures such as trench capacitors. The greater dielectric thickness and higher operating voltages of trench transistors render the corner thinning effects much more acute in the case of trench transistors. FIG. 3 illustrates another problem with trench transistors that involves electric field crowding at the corners of the gate. When one voltage, $V_G$, is applied to the gate and a different voltage, $V_D$, is applied to the drain, an electric field is established through the gate oxide, represented by field lines 44. The field lines become crowded at the corners of the gate, intensifying the field gradient in this region. Unfortunately, this is the same region in which oxide thinning might occur, which can further increase the field gradient and lead to breakdown or leakage current.

Gate leakage current may occur by a variety or combination of mechanisms such as Fowler-Nordheim tunneling or trap-assisted tunneling. Several aspects of trench transistors might contribute to these or similar mechanisms resulting in greater gate leakage current. For example, thinner oxide that may be present at the trench corners provides a lower barrier for carriers to overcome. Also, it is believed that the stress in a thinned oxide layer at a corner strains the Si—O bonds, allowing a carrier with less energy to break the Si—O bonds and overcome the dielectric barrier. It is further believed that the stress forms trapping sites within the strained oxide layer, which allows easier transport of carriers through the oxide.

An artifact of the trench-forming process (e.g., dry etch) is that the trench wall has a surface that is rougher than the typical surface of a polished silicon wafer. After the growth of an oxide layer on the rough surface, it is believed that a larger number of traps exist in the bulk oxide and a larger number of dangling bonds exist at the Si—Oxide interface than would exist in an oxide layer formed on a conventional, polished silicon surface. Thus, some of the leakage current arises from conditions not normally found in conventional MOSFETs. Unfortunately, gate leakage current can degrade the quality of the gate oxide, creating more traps and thus leading to more leakage current. The high-voltage, high-current operating conditions of trench transistors may accelerate this process by providing a large number of high-energy carriers.

Therefore, it is important that trench transistors have not only a uniform gate oxide layer, but that the layer be relatively stress-free, especially in the regions of high field gradients, such as at the corners of the gate. The present invention achieves this, in one embodiment, by growing the oxide layer at a temperature well above the temperatures used in conventional thermal oxidation processes. For example, conventional thermal oxide processes take place at about 900–950° C. At this temperature, a thin oxide of a few hundred Angstroms can be grown in a controllable amount of time, such as several minutes, but will exhibit corner thinning and have residual stress. According to the present invention, however, trench gate oxide is preferably grown at about 1,100° C. or higher, resulting in substantially reduced corner thinning and substantially reduced residual stress at the corners, as well. At this higher temperature the viscosity of the oxide decreases, allowing the oxide to flow laterally as it grows in response to the crowding stress at the corners. Thus, not only is thinning reduced, but the residual stress is also reduced. The resulting bulk silicon-oxide interface is also smoother, because of the reduced stress and/or lateral flow. This interface smoothing also reduces carrier scattering and increases mobility in the channel region of the trench transistor. At such elevated temperatures, limited thermal budgets and rapid oxide growth can become problems if steps are not taken to address these effects. For example, rapid thermal processing (RTP) may be employed to avoid exceeding the thermal budget allowed by the process flow. Also, partial pressure of oxygen in the furnace can be reduced to slow down oxide growth.

Figure 4:
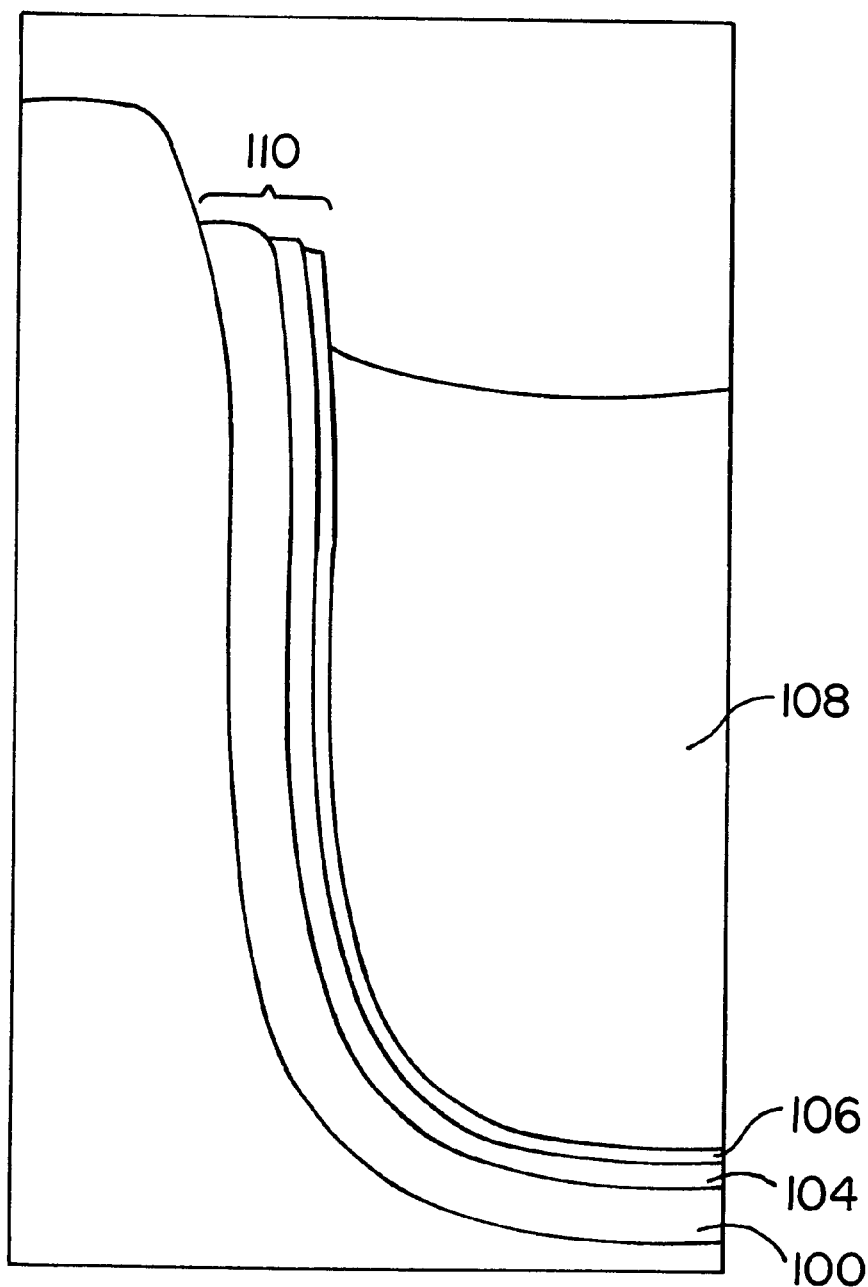
FIG. 4 illustrates a composite oxide-nitride-oxide dielectric layer in greater detail for a trench transistor according to the present invention.

Gate leakage current in trench MOSFETs is further reduced according to the present invention by inserting an additional barrier layer in the gate dielectric material. FIG. 4 illustrates a cross-sectional view of a composite oxide-nitride-oxide dielectric layer 110 for a trench transistor according to an embodiment of the present invention. According to this embodiment, trench gate dielectric layer 110 includes a first or outer oxide layer 100, a middle silicon nitride layer 104, and a second or inner oxide layer 106. First oxide layer 100 is thermally grown to a thickness of, for example, 300 Å. In a preferred embodiment, first oxide layer 100 is grown at the higher temperature of 1,100° C. The wafer may be preferably a (100) single-crystal silicon wafer with a nominal doping concentration of $1\times10^{16}$ cm$^{-3}$ using, e.g., Boron or Phosphorous.

Silicon nitride layer 104 is deposited using preferably a low-pressure chemical-vapor deposition ("LPCVD") process to form a layer of silicon nitride having an exemplary thickness of approximately 120 Å. The LPCVD process, as opposed to, e.g., CVD carried out at atmospheric pressure, provides good step coverage that results in a conformal layer of uniform thickness to line the trench. After depositing silicon nitride layer 104, inner thermal oxide layer 106 is grown to an exemplary thickness of approximately 50 Å. Inner oxide layer 106 promotes adhesion to gate polysilicon 108 and serves to balance stress between the silicon nitride layer and the gate oxide layer, and to serve as stress relief between the silicon nitride layer and the polysilicon gate. The resulting gate dielectric structure 110, which includes the gate oxide layer 100, silicon nitride layer 104, and inner oxide layer 106, has an exemplary thickness of about 470 Å.

Figure 5:
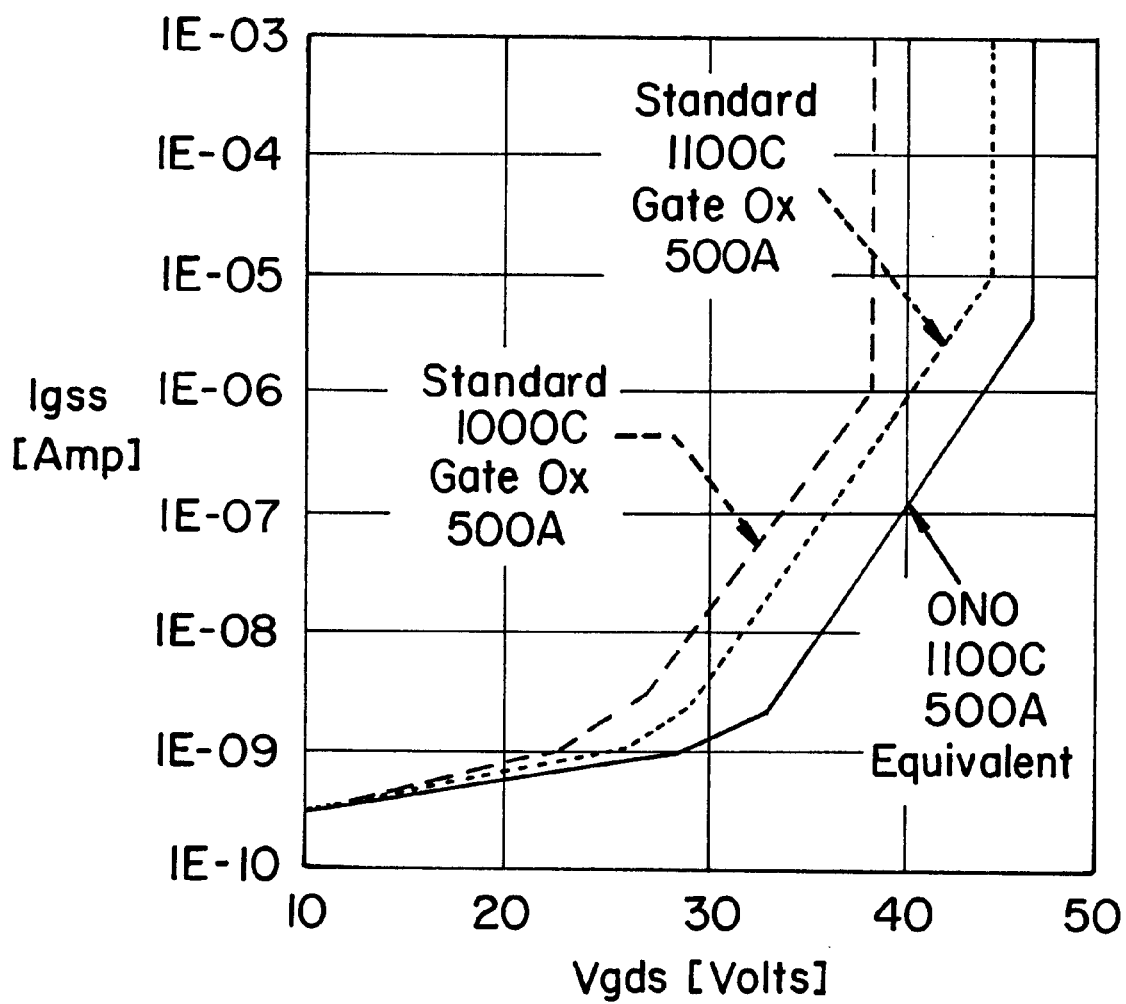
FIG. 5 is a graph of gate leakage current versus gate voltage for various gate dielectric structures.

FIG. 5 shows the gate leakage and gate rupture voltage for various gate dielectric layers. A standard 500 Å gate oxide grown at 1000° C. is shown to have a gate leakage current $I_{GSS}$ of about 10 nA at a $V_{GSS}$ of 30 V, and a gate rupture voltage of about 38 V. By comparison, a gate oxide of the same thickness grown at a temperature of 1100° C. in accordance with the present invention has an $I_{GSS}$ of about 4 nA at $V_{Gss}$=30 V, and a gate rupture voltage of about 44 V. The oxide-nitride-oxide dielectric layer shown in FIG. 4, which has a thickness equivalent to the gate oxide layers, has an $I_{GSS}$ of only about 1 nA at $V_{GSS}$=30 V, and a surprisingly high gate rupture voltage of about 47 V.

The comparison between the gate leakage currents and gate rupture voltages for gate oxide layers of trench transistors grown at conventional temperatures and grown according to the present invention shows that a superior gate dielectric layer is produced by growing the gate oxide layer at a temperature above about 1100° C. Furthermore, the addition of a relatively thin layer of silicon nitride further improves the performance of the gate dielectric layer without increasing the total thickness of the gate dielectric layer.

Figure 6A:
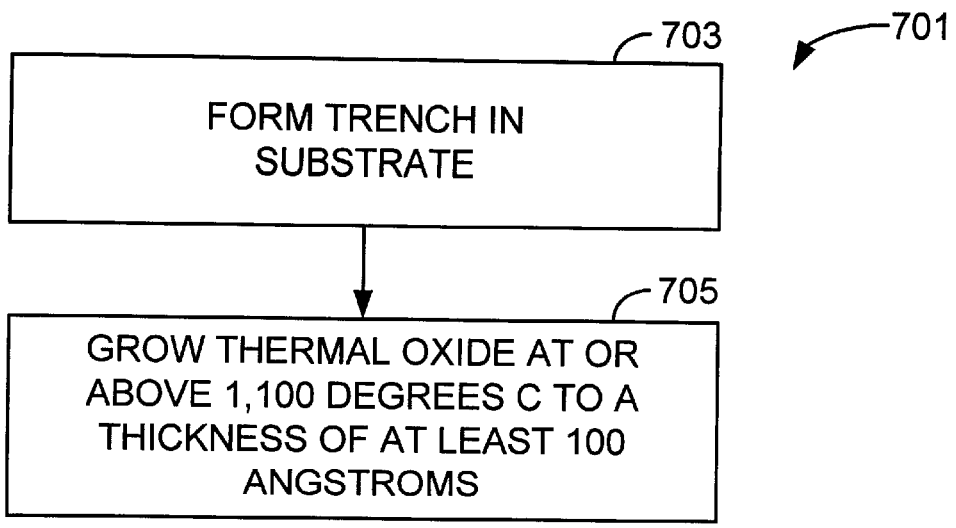
FIG. 6A is a simplified flow chart of a method for forming a gate dielectric oxide layer according to an embodiment of the present invention.

FIG. 6A is a simplified flow chart of a method 701 of manufacturing a gate oxide layer according to an embodiment of the present invention. A trench is formed in a silicon substrate (step 703). A thermal oxide layer is then grown at a temperature above about 1100° C. to a thickness of at least about 100 A (step 705) to line the trench.

Figure 6B:
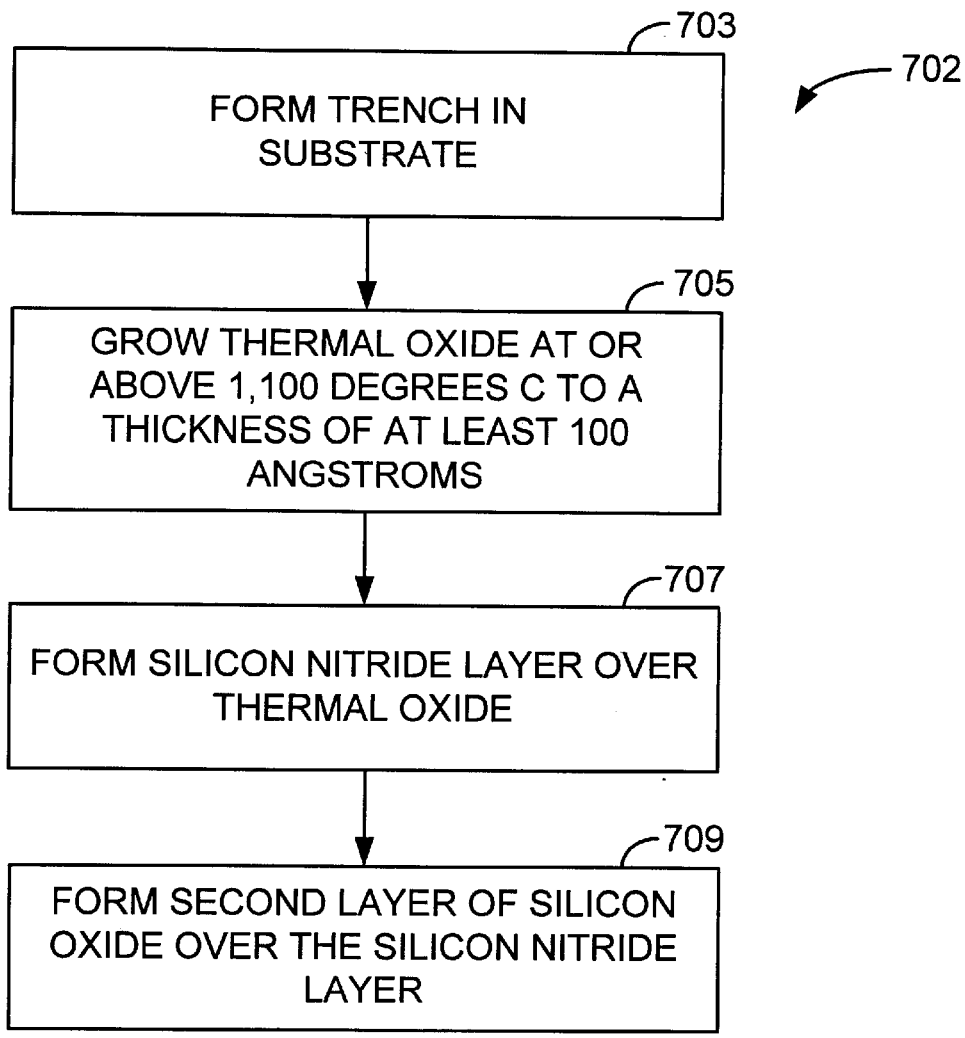
FIG. 6B is a simplified flow chart of a method for forming a gate dielectric layer according to another embodiment of the present invention.

FIG. 6B is a simplified flow chart of a method 702 of manufacturing a gate dielectric layer according to another embodiment of the present invention. A trench is formed in a silicon substrate (step 703) and a thermal oxide layer is grown at a temperature of above about 1000° C., and preferably at 1100° C., to a thickness of at least about 100 A (step 705) to line the trench. A layer of silicon nitride is formed over the thermal oxide layer (step 707), such as by LPCVD, and a second layer of silicon oxide is formed over the silicon nitride (step 709).

While the above is a complete description of specific embodiments of the present invention, various modifications, variations, and alternatives may be employed. For example, although LPCVD has shown to produce a uniform, conformal layer of silicon nitride, other deposition processes may produce suitably uniform layers within a trench, depending on the trench geometry. Alternatively, a composite gate dielectric layer may be formed by nitriding the gate oxide layer, either before or during thermal oxide growth. Similarly, although a gate dielectric layer 500 A thick was given as a specific example, thicker or thinner gate dielectric layers may be appropriate according to the design of the device. Therefore, the scope of this invention should not be limited to the embodiments described, and should instead be defined by the following claims.

What is claimed is:

1. A trench field effect transistor, comprising:
   a substrate of a first conductivity type, the substrate embodying a drain of the transistor;
   a body layer of a second conductivity type formed over the substrate, the body layer having an upper surface;
   a trench extending through the body layer and into the substrate, the trench defined by upper corners at the upper surface of the body layer, lower corners at the bottom of the trench, and walls formed therebetween;
   a dielectric layer lining the walls, lower corners and bottom of the trench, thereby forming a dielectric-lined trench;
   a conductive gate material lining the entire bottom and substantially filling the dielectric-lined trench; and
   a source region of the first conductivity type flanking the trench,
   wherein the dielectric layer comprises a first oxide layer lining the walls, lower corners and bottom of the trench, a silicon nitride layer disposed on the first oxide layer, and a second oxide layer disposed between the silicon nitride layer and the conductive gate material.

2. The trench transistor of claim 1, wherein the first oxide layer has a first thickness of at least about 300 Å, the silicon nitride layer has a second thickness of about 120 Å, and the second oxide layer has a third thickness of about 50 Å.

3. A trench field effect transistor, comprising:
   a substrate of a first conductivity type, the substrate embodying the drain of the transistor;
   a body layer of a second conductivity type formed over the substrate;
   a trench extending through the body layer and into the substrate;
   a first oxide layer thermally grown on walls and bottom of the trench;
   a silicon nitride layer disposed on the first oxide layer;
   a second oxide layer disposed on the silicon nitride layer, thereby forming a second-oxide-lined trench having a bottom surface and sidewalls; and
   a conductive gate material lining the entire bottom surface and substantially filling the second-oxide-lined trench.

4. The trench transistor of claim 3, wherein the first oxide layer is grown at a temperature of at least about 1,100° C.

5. The trench transistor of claim 4, wherein the first oxide has a thickness of about 300 Å.

6. The trench transistor of claim 5, wherein the silicon nitride layer has a thickness of about 120 Å.

7. The trench transistor of claim 6, wherein the second oxide layer has a thickness of about 50 Å.

* * * * *